United States Patent
Parrott et al.

(10) Patent No.: US 8,350,629 B2
(45) Date of Patent: Jan. 8, 2013

(54) DIFFERENTIAL RESONANT RING OSCILLATOR UTILIZING MAGNETICALLY TUNED YIG RESONATORS TO ACHIEVE ULTRA LOW PHASE NOISE AND MULTI-OCTAVE ELECTRONIC TUNING IN MICROWAVE FREQUENCIES

(76) Inventors: Ronald A. Parrott, Healdsburg, CA (US); Allen A. Sweet, Alameda, CA (US)

(*) Notice: Subject to any disclaimer, the term of this patent is extended or adjusted under 35 U.S.C. 154(b) by 0 days.

(21) Appl. No.: 13/060,002

(22) PCT Filed: Aug. 20, 2009

(86) PCT No.: PCT/US2009/054549
§ 371 (c)(1),
(2), (4) Date: Feb. 21, 2011

(87) PCT Pub. No.: WO2010/022292
PCT Pub. Date: Feb. 25, 2010

(65) Prior Publication Data
US 2011/0148532 A1 Jun. 23, 2011

Related U.S. Application Data

(60) Provisional application No. 61/090,313, filed on Aug. 20, 2008.

(51) Int. Cl.
*H03B 5/18* (2006.01)

(52) U.S. Cl. .................... 331/96; 331/57; 331/36 L
(58) Field of Classification Search ............. 331/36 L, 331/45, 57, 96, 117 D, 107 DP
See application file for complete search history.

(56) References Cited

U.S. PATENT DOCUMENTS

| | | |
|---|---|---|
| 4,988,959 A | 1/1991 | Khanna et al. |
| 5,801,591 A | 9/1998 | Parrott |
| 5,959,513 A | 9/1999 | Parrott |
| 6,348,840 B2 | 2/2002 | Ezura et al. |

*Primary Examiner* — Joseph Chang
(74) *Attorney, Agent, or Firm* — Craig M. Stainbrook; Stainbrook & Stainbrook, LLP

(57) ABSTRACT

A differential resonant ring oscillator ("DRRO*") circuit using a ring oscillator topology to electronically tune the oscillator over multi-octave bandwidths. The oscillator tuning is substantially linear, because the oscillator frequency is related to the magnetic tuning of a YIG sphere, which has a resonant frequency equal to a fundamental constant multiplied by the DC magnetic field. The simple circuit topology uses half turn or multiple half turn loops magnetic coupling methods connecting a differential pair of amplifiers into a feedback loop configuration having a four port YIG tuned filter, thus creating a closed loop ring oscillator. The oscillator may use SiGe bipolar junction transistor technology and amplifiers employing heterojunction bipolar transistor technology SiGe is the preferred transitor material as it keeps the transistor's 1/f noise to an absolute minimum in order to achieve minimum RF phase noise.

6 Claims, 10 Drawing Sheets

DIFFERENTIAL RESONANT RING OSCILLATOR UTILIZING MAGNETICALLY TUNED YIG RESONATORS TO ACHIEVE ULTRA LOW PHASE NOISE AND MULTI-OCTAVE ELECTRONIC TUNING IN MICROWAVE FREQUENCIES

STATEMENT REGARDING FEDERALLY SPONSORED RESEARCH OR DEVELOPMENT

The present invention was made with government support under Contract No. LEW-18512-1 awarded by the National Aeronautics and Space Administration. The Government has certain rights in the invention.

BACKGROUND OF THE INVENTION

1. Technical Field

The present invention relates generally to oscillator circuits for high frequency sources, and more particularly to a differential resonant ring oscillator circuit using a ring oscillator topology to electronically tune the oscillator over multi-octave bandwidths 2. Background Art The background art is aptly described in only a few relevant documents, which include patents issued to one of the inventors of the present invention; notably, U.S. Pat. No. 5,801,591 to Parrott, which teaches a multi-octave ferrite oscillator topology that utilizes transformer coupling to provide the proper phase shift in the feedback loop. A ferrite element is magnetically saturated to produce a magnetic resonance An active element provides real impedance and gain over a wide frequency range at an input port. The input port is electrically coupled to a first inductive coupling structure that is electrically coupled to an RF current source/sink, such as ground. The magnetic resonance in the ferrite element induces a current in the coupling structure which is amplified and shifted in phase 180 degrees by the active element. The output of the active element drives a second inductive coupling structure that closes a feedback loop and provides an oscillator output signal. The first inductive coupling structure, ferrite element, and second inductive coupling structure act as a transformer when tuned to a resonance, thus providing the proper phase shift and current gain.

Next, U.S. Pat. No. 5,959,513 to Parrott describes an improved coupling structure for a ferrite-based resonator. The structure includes a mounting rod and a ferrite sphere mechanically coupled to a substrate that provides support for a stiff coupling loop. The structure reduces differential movement between the sphere and the coupling loop, thereby reducing vibration-induced degradation of resonator performance. The support structure also allows controllable insertion, removal, and rotation of the resonating element with respect to the RF coupling element. The support structure may be mechanically coupled to the RF coupling element to further reduce differential motion between the resonating element and the RF coupling element.

U.S. Pat. No. 6,348,840 to Ezura et al. discloses a variable-tuned type YIG oscillator with reduced mechanical variations in the resonance circuit. An amplifier element, electrode, circuit pattern, and other devices of the oscillator circuit portion of a YIG oscillator are integrated on the front face of a semiconductor substrate by the monolithic microwave integrated circuit manufacturing technique. A coupling loop is formed as a thick film conductor shaped so as to surround at least a portion of the outer periphery of a YIG crystal ball on the semiconductor substrate having the amplifier element, electrode, circuit pattern and others formed thereon. A hole for positioning a YIG crystal ball at a predetermined position inside of the coupling loop is formed in the semiconductor substrate from the front surface of the substrate, and the YIG crystal ball is fitted and fixed in the hole.

Finally, see U.S. Pat. No. 4,988,959, to Khanna et al, which teaches a broadband YIG-tuned oscillator having both series and parallel feedback. The oscillator includes a transistor capable of driving a load coupled to a first port thereof; a reactive feedback element coupled to a second port of the transistor; a YIG resonator, including means for tuning a YIG crystal for resonance throughout a range of frequencies; and a coupling to couple the YIG resonator to both a third port of the transistor and to the first port of the transistor.

The foregoing patents reflect the current state of the art of which the present inventors are aware. Reference to, and discussion of, these patents is intended to aid in discharging Applicants' acknowledged duties of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

DISCLOSURE OF INVENTION

The present invention is a YIG tuned oscillator circuit that uses a differential gain topology that enables the oscillator to achieve an extremely broadband electronic tuning range while at the same time achieving ultra low phase noise. As a natural result of the differential circuit topology, reactive elements have been eliminated. This includes such things as tuning stubs that limit tuning bandwidth by contributing excessive open loop change in phase shift. The open loop phase shift of the differential oscillator is associated with completely non-dispersive circuit elements, such as the physical angle of the coupling loops, a differential loop crossover, and the high frequency phase shift of the amplifiers or gain stages. The differential gain topology also solves the major problem with the resonant ring oscillator previously patented in that parasitic RF currents can be prevented from coupling to resonators. When parasitic RF currents couple to the resonators they are superimposed on the desired currents resulting in degradation of quality factors (Q) due to magnetic field distortion or phase reversals which can stop oscillations. Specifically, all RF currents in the disclosed designs are confined to the desired coupling mechanisms. This common mode rejection approach will enable interface with existing Monolithic Microwave Integrated Circuit (MMIC) designs facilitating broad product usage.

In bench tests of the inventive circuit, the input of the oscillator feedback loop comprised a pair of differentially connected NPN SiGe transistors that produced extremely high gain, and because the SiGe transistors are bulk effect devices, they also achieved extremely low 1/f noise (leading to ultra low RF phase noise). The 1/f corner frequency for NPN SiGe transistors is approximately 500 Hz. The RF energy from the collector output of the transistor is connected directly to the top-coupling loop (the excitation loop) of a single sphere YIG tuned filter. A uniform magnetic field to bias the YIG must be at a right angle to any vector associated with an RF current in a coupling loop in order for the precession to interact with the RF currents. In this example, a second, bottom, coupling loop (the feedback loop) transfers RF energy out of the YIG filter and connects it, in a fully differential configuration, to the input of the differential pair of transistors. The conditions for start oscillation for a ring oscillator require that its open loop phase shift be equal to N*(360 degrees), where N is an integer equal to 0, 1, 2, 3 . . . , and its open loop gain must be greater than 1.0 (or 0 dBs). The electrical phase shift associated with the relative coupling loop to coupling loop physical angle is simply equal to the relative angle between the loops, which is usually +/−90 degrees dependent on the relationship of the bias magnetic field direction vector and the Poynting direction vector of the loops. The choice of 90 degrees is important because it places the RF magnetic fields of the two loops in quadrature, which eliminates any RF energy coupling between the two loops, unless it is coupled through the mechanism of the YIG sphere's resonance By preventing any non-YIG controlled stray coupling mechanisms, a chief source of spurious oscillations is eliminated. The direction of the magnetic field is important because the sign of the 90° Phase shift depends on the direction of the magnetic field. In one case the oscillator will oscillate, and in the other case the oscillator will not oscillate over original frequency range but may oscillate over a different frequency determined by the +90 degree solution to the requirement of)N*(360°) phase shift around the oscillation loop. The Phase shift of the cross over network is a natural 180 degrees at all frequencies with the loops on either side of the sphere and 0 degrees on the same side. The phase shift of the bipolar transistor pair is equal to 180 degrees at low frequencies, quickly moving to 270 degrees at high frequencies. Under these conditions, the total phase shift around the loop becomes equal to (−90+180+270)=360 degrees over a very wide range of frequencies, which means N=1.0 over a wide frequency band. The differential output from the transistor pair is a perfect configuration match for the naturally differential coupling loops of this YIG tuned filter. The YIG filter has a Q of greater than 1000, significantly contributing to the excellent overall phase noise of the oscillator. Therefore the differential oscillator's electronic tuning can achieve multiple octaves of tuning, perhaps approaching a full decade. Oscillations will naturally occur at all frequencies for which the YIG sphere is tuned, magnetically biased, to resonance by the DC magnetic field, without the need to make adjustments of any kind to a frequency selective reactive network, such as a tuning stub. By eliminating the need for making alignment adjustments, we expect the differential oscillator to be low cost in manufacturing.

Output from this oscillator can be taken from the collectors in a differential manner assuring that a balance is maintained to keep both transistor collectors at the same impedance. Another approach is to add another coupling loop to sample the RF field in the YIG sphere and amplifying it to the desired output while exercising care to not degrade the Q in the YIG below the appropriate value for the required phase noise.

To test the concepts set forth above, a breadboard hybrid differential oscillator has been constructed; refer to FIG. 14. The breadboard has yielded strong continuous oscillations from 11 GHz to 24 GHz. Parasitic circuit elements that are a practical result of the hybrid construction techniques (bond wires and ribbon interconnects) used in the breadboard unit are limiting the full electronic tuning potential of this kind of circuit topology. However the basic operational potential of the circuit is confirmed by the breadboard tests. The breadboard oscillator's measured phase noise is excellent and is in close agreement with the computer simulations of its phase noise.

Another model has been constructed using hetrojunction bipolar transistor (HBT) made from InGaP/GaAs and they operated as expected with 2 modes of operation depending on the direction of the magnetic field vector. The first frequency was from 10 to 20 GHz and with the magnetic field direction reversed the oscillation frequency was 4 to 9 GHz and 21 to 22 GHz with no oscillations 10 to 20 GHz.

Other novel features characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawing is for illustration and description only and is not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

BRIEF DESCRIPTION OF THE DRAWINGS

The invention will be better understood and objects other than those set forth above will become apparent when consideration is given to the following detailed description thereof. Such description makes reference to the annexed drawings wherein.

BEST MODE FOR CARRYING OUT THE INVENTION

Figure 1:
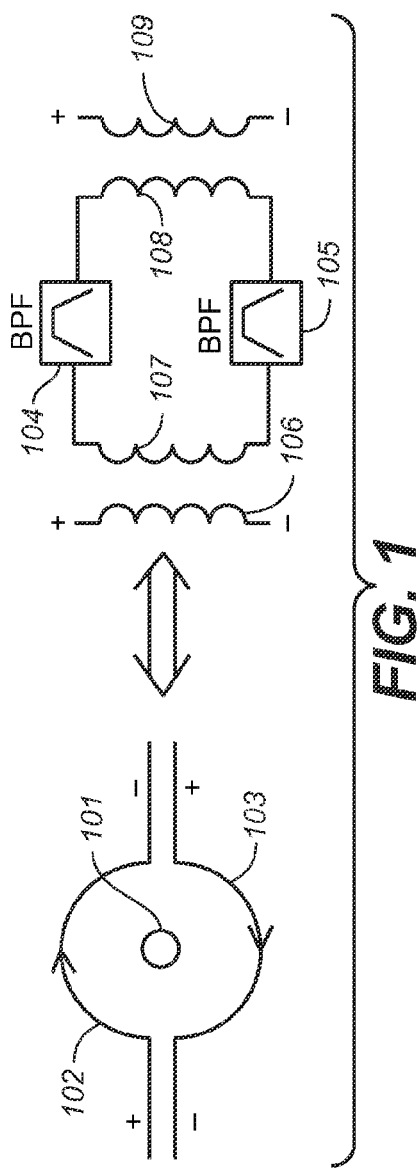
FIG. 1 is a schematic diagram showing a pair of coupling loops that transfer RF energy into and out from a YIG sphere.

Referring to FIG. 1 a drawing is seen of a pair of coupling loops (preferably half turn) that transfer RF energy into and out of the YIG sphere. These loops provide a natural differential electrical interface to the rest of the oscillator's circuit. An equivalent circuit model for the pair of coupling loops (plus the YIG sphere) is constructed as a pair of transformers that are interconnecting two identical band-pass filters. The filter's pass-band peak is at the YIG sphere's resonant frequency, as determined by the DC magnetic field.

Still referring to FIG. 1, in the physical configuration, collector excitation loop 102 and base feedback loop 103 are physically oriented around YIG sphere 101.

Still referring to FIG. 1, it can be seen that equivalent electrical model of the arrangement has collector excitation loop 106 inducing energy into effective inductor 107, through effective band-pass filters 104 and 105, causing effective inductor 108 to generate energy that is coupled to base feedback loop 109.

Figure 2:
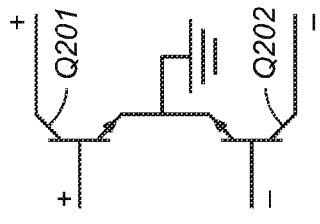
FIG. 2 is a schematic diagram showing a differential pair of NPN bipolar transistors with emitters are connected to a common ground.

Referring next to FIG. 2, a schematic diagram is shown of a differential pair of NPN bipolar transistors Q201 and Q202 whose emitters are connected to a common ground (the integrated circuit's substrate ground via). The emitters are generally connected to each other, and can be connected to ground (as shown) or connected to a load which can be used to extract energy from the oscillator.

Figure 3:
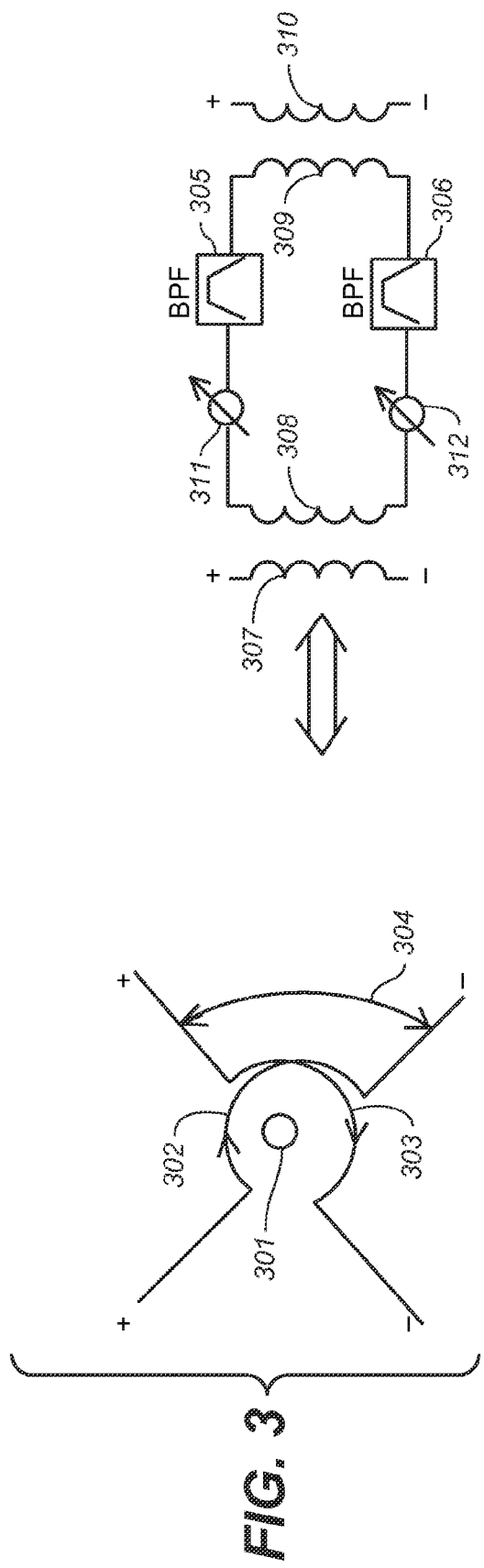
FIG. 3 is a diagram showing a pair of coupling loops with a relative physical angle existing between the loops.

Referring now to FIG. 3, what is seen is a drawing of a pair of coupling loops (collector excitation loop 302 and base feedback loop 303, again, preferably half turn) with a relative physical angle 304 existing between the loops. The electrical model for these coupling loops plus YIG sphere 301 is almost identical to the electrical model shown in FIG. 1; however it contains two additional electrical phase shifter elements (311 and 312 in the equivalent electrical model of the oscillator's arrangement) that account for the phase shift between the two offset loops.

The value of these phase shifters is equal to the relative physical angle between the loops. In most cases the angle between the loops will be chosen to be 90 degrees. This choice insures that all RF energy passing between the coupling loops must be coupled through the YIG sphere's resonance. This is because a 90 degree physical offset between the coupling loops places the coupling loop's respective RF magnetic fields in perfect quadrature, which prevents any direct coupling between the loops for occurring. It is very important to prevent any direct coupling between loops because this kind of coupling can cause spurious oscillations to occur.

Still referring to FIG. 3, it can be seen that equivalent electrical model of the oscillator's arrangement has collector excitation loop 307 inducing energy into effective inductor 308, through effective band-pass filters 305 and 306, causing effective inductor 309 to generate energy that is coupled to base feedback loop 310. The phase relationships shown by angle 311 and angle 312 are determined by the physical orientation between excitation loop 307 and base feedback loop 310.

Figure 4:
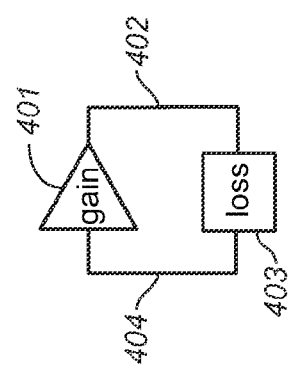
FIG. 4 is a block diagram showing the ideal start oscillation conditions for a ring oscillator.

Referring next to FIG. 4 is a block diagram showing the ideal start oscillation conditions for a ring oscillator. The oscillator consists of a gain component 401, a gain component output path 402, a loss component 403, and a gain component input path 404. The conditions that will start oscillations are: (1) the gain produced by gain component 401 is greater than the loss produced by loss component 403; and (2) the phase shift around the feedback loop is a multiple of 360 degrees, represented as N(360 degrees), where N=0, 1, 2, 3, 4 . . .

Figure 5A:
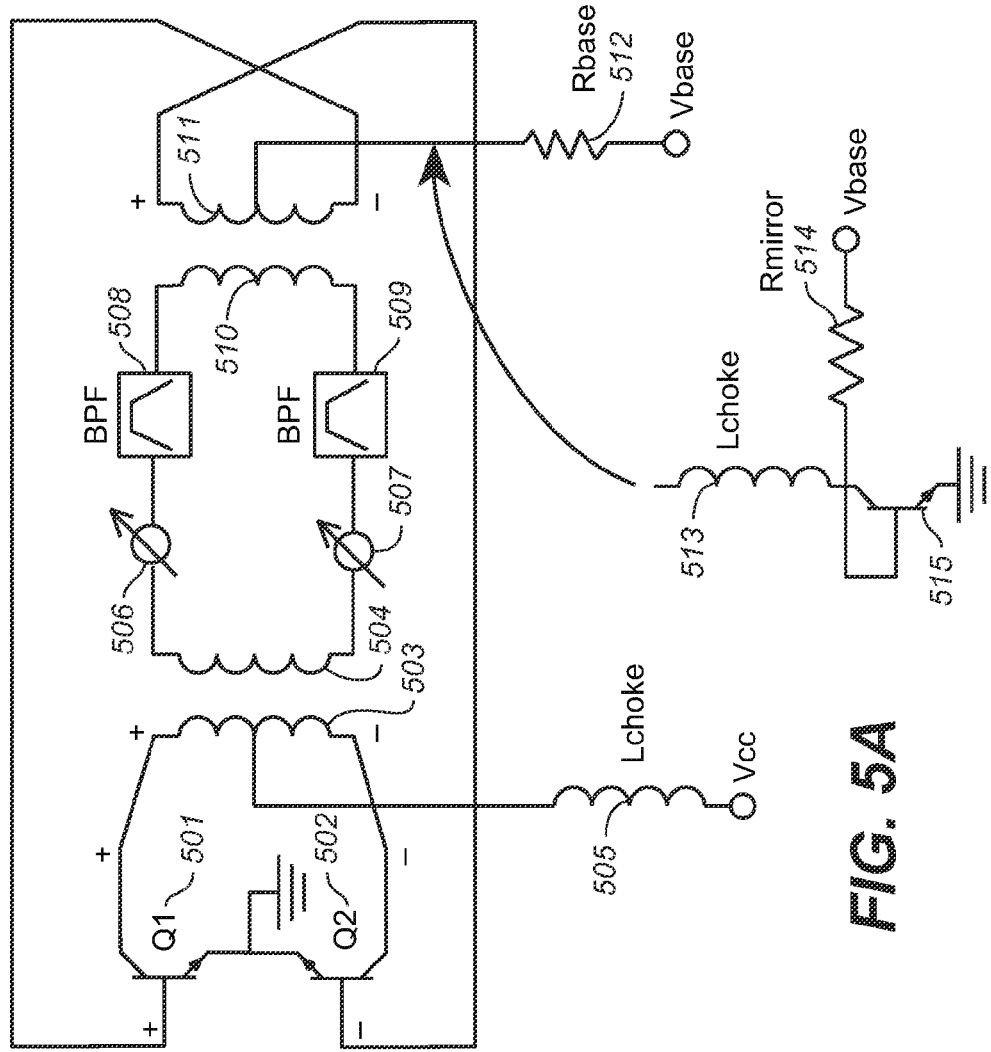
FIG. 5a is a schematic diagram of the first preferred embodiment of the inventive YIG tuned differential ring oscillator.

Referring now to FIG. 5a, what is seen is a schematic diagram of the YIG tuned differential ring oscillator. It can be seen that collector Vcc is provided at the Vcc input terminal, and is passed through inductor 505 and through the center tap of collector excitation loop 503, from where it is distributed to the collectors of transistors 501 and 502. The emitters of transistors 501 and 502 are connected to circuit ground.

Two transistor base biasing options are shown in FIG. 5a. The first is simply having the base bias voltage provided at the Vbase input terminal, and pass through resistance 512, and then on to the center tap of base feedback loop 511, from where it is distributed to the bases of transistors 501 and 502. The second (optional) biasing method uses a current mirror circuit that stabilizes the collector current against changes in process and temperature. In this optional arrangement, the base bias voltage is provided at the Vbase input terminal, and passes through mirror resistance 514, and then on to the base of transistor 515. The emitter of transistor 515 is connected to circuit ground. The collector of transistor 515 is connected to one side of inductor 513, and the other side of inductor 513 is connected to the center tap of base feedback loop 511, from where the base bias voltage is distributed to the bases of transistors 501 and 502.

An effective equivalent circuit is shown to represent the YIG sphere in the circuit. Effective inductor 504 transfers energy received from collector excitation loop 503, through effective band-pass filters 508 and 509, causing effective inductor 510 to generate energy that is coupled to base feedback loop 511. The phase relationships shown by angle 506 and angle 507 are determined by the physical orientation between excitation loop 503 and base feedback loop 511. The open loop phase shift of the circuit is 360 degrees, which is determined by non-dispersive components, making it possible to achieve ultra wide electronic tuning bandwidth. The loops are connected in such a way that a 180 degree phase shift is created by means of a current crossover 516 to make the exciter current 180 degrees different from the feedback current delivered through the YIG sphere.

Figure 5B:
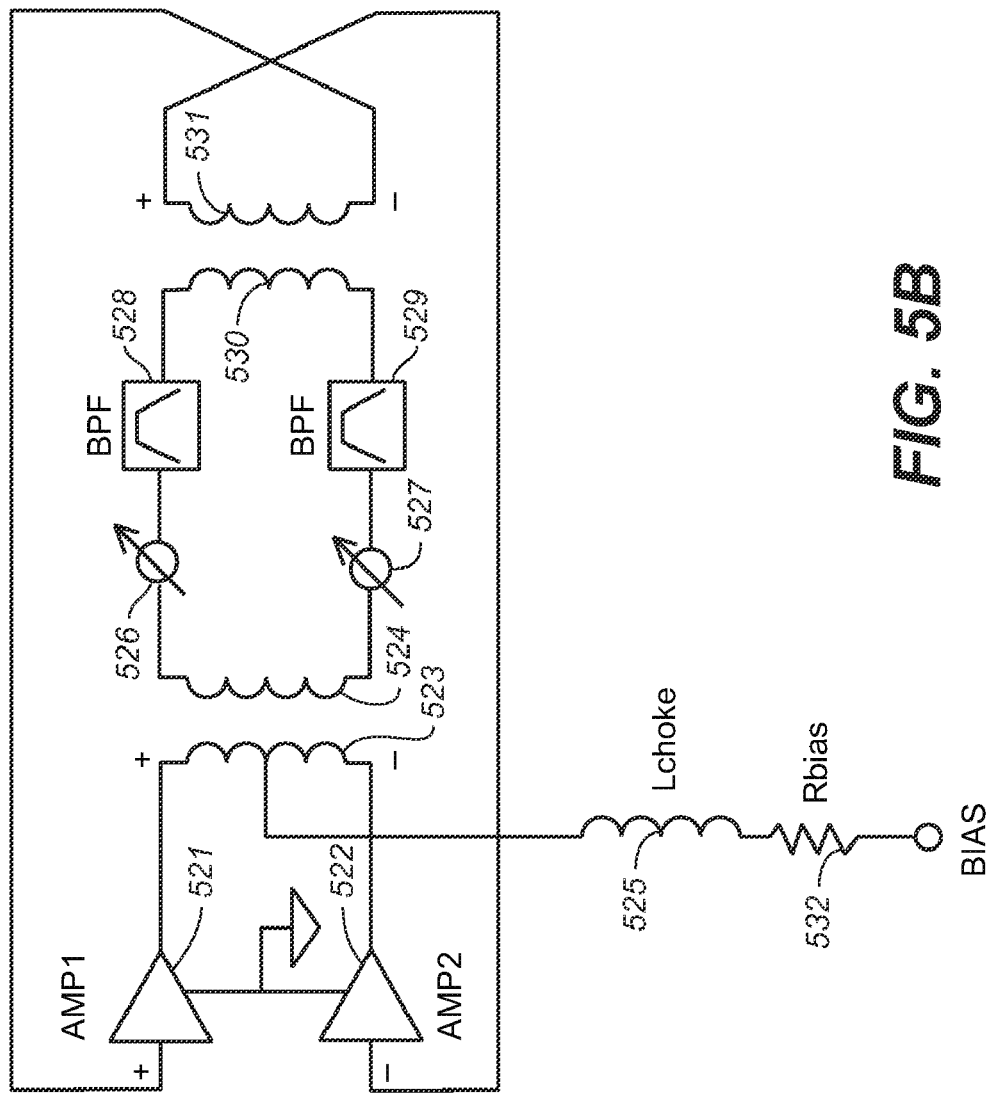
FIG. 5b is the schematic diagram of an alternative embodiment of the inventive YIG tuned differential ring oscillator.

Referring now to FIG. 5b, there is shown a schematic diagram of an alternative embodiment of the YIG tuned differential ring oscillator. It can be seen that a bias voltage is provided at the bias input terminal, and is passed through resistance 532, and through inductor 525 and through the center tap of collector excitation loop 523, from where it is distributed to the operating voltage inputs of unit amplifiers 521 and 522.

An effective equivalent circuit is shown to represent the YIG sphere in the circuit. Effective inductor 524 transfers energy received from collector excitation loop 523, through effective band-pass filters 528 and 529, causing effective inductor 530 to generate energy that is coupled to base feedback loop 531. The phase relationships shown by angle 526 and angle 527 are determined by the physical orientation between excitation loop 523 and base feedback loop 531.

The open loop phase shift of the circuit is 360 degrees, which is determined by non-dispersive components, making it possible to achieve ultra wide electronic tuning bandwidth.

Figure 6:
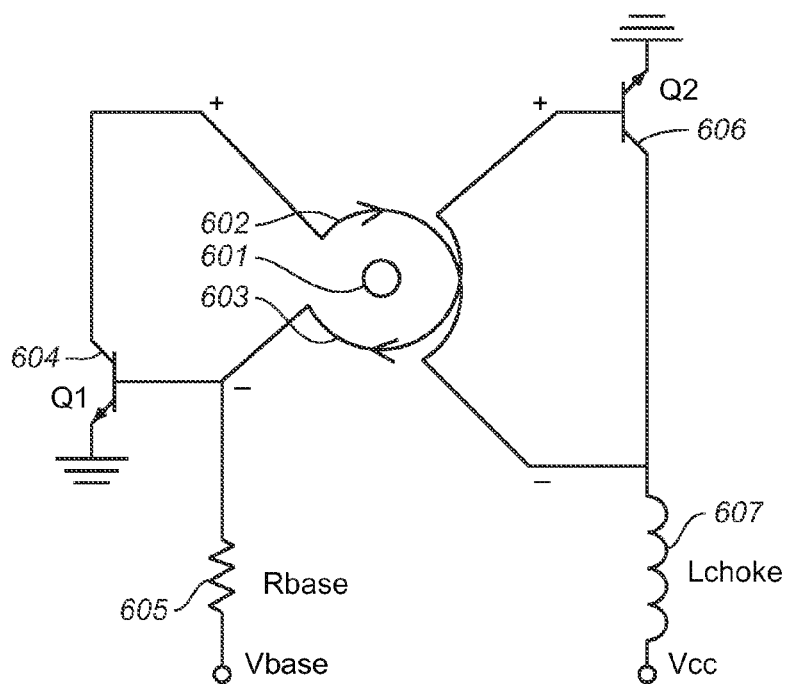
FIG. 6 is a layout diagram of the YIG tuned differential ring oscillator circuit of the present invention.

Referring next to FIG. 6, what is seen is a semi-schematic layout of the YIG tuned differential ring oscillator. RF collector current from transistors 604 and 606 flows in collector loop 602, creating an RF magnetic field that is coupled to YIG sphere 601. At YIG sphere 601's resonant frequency, the RF magnetic field is coupled to base loop 603, creating an RF base current which flows into the bases of transistors 604 and 606. Transistor base bias voltage is provided through the Vbase input, and then via resistance 605 to the base of transistor 604. From there the base bias voltage is made available (via base loop 603) to the base of transistor 606. Transistor collector Vcc is provided through the Vcc input, and then via inductor 607 to the collector of transistor 606. From there the collector Vcc is made available (via collector loop 602) to the collector of transistor 604.

Figure 7:
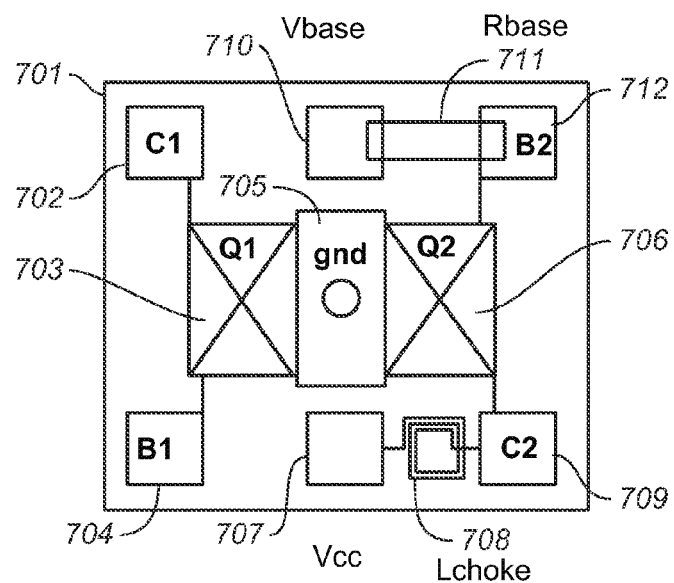
FIG. 7 is a circuit layout for the inventive YIG tuned differential ring oscillator's gain stage integrated circuit.

The open loop phase of this configuration is completely determined by the natural crossover of the loop-transistor interconnection (180 degrees) plus the mechanical angle between the coupling loops (−90 degrees), and the high frequency phase shift of the NPN transistor differential pair) (270°) for a total of 360 degrees of essentially non-dispersive phase shift, satisfying the conditions for start oscillation at all frequencies for which YIG sphere 601 is resonant Turning next to FIG. 7, the YIG tuned differential ring oscillator's integrated circuit layout is shown. The emitters of transistors 703 and 706 are grounded at a substrate via which is connected to the IC's substrate 701 and its backside ground. Operating voltage is provided at Vcc input 707, which is connected through choke 708 to point 709. Point 709 is connected to the collector of transistor 706. The base of transistor 706 is connected to point 712. The base voltage is provided at Vbase input 710, and is passed to point 712 via resistance 711. The collectors of transistors 703 and 706 are connected via the excitation loop (not shown here), and the bases of transistors 703 and 706 are connected via the feedback loop (not shown here).

Figure 8:
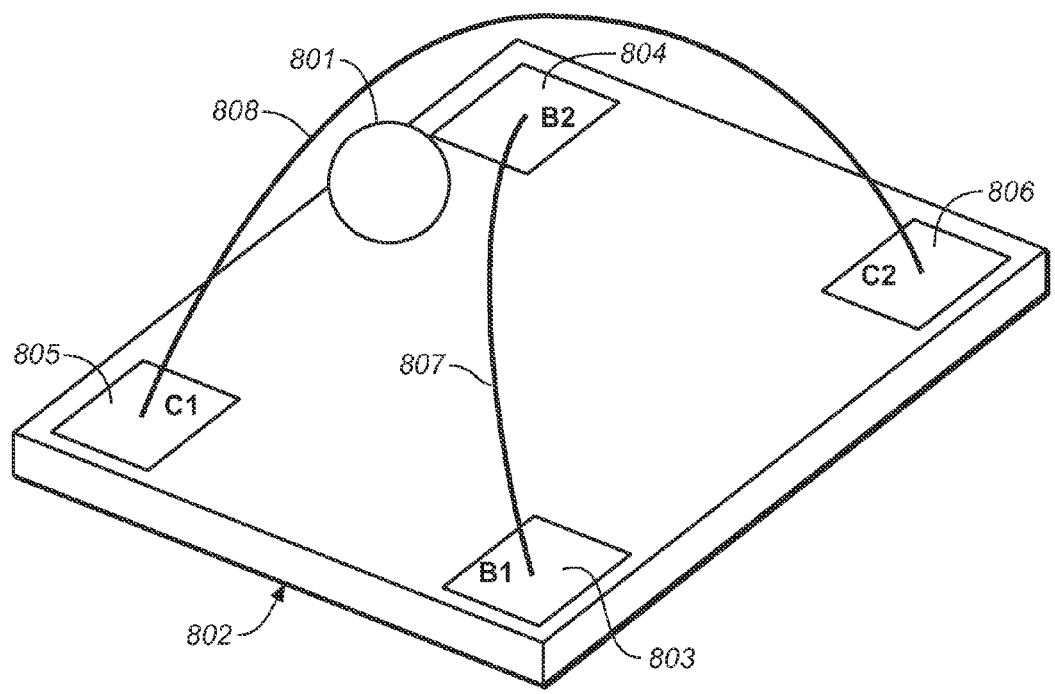
FIG. 8 is a schematic view showing the mechanical configuration of the oscillator's integrated circuit, including the YIG sphere and associated coupling loops.

Now referring to FIG. 8, the mechanical configuration is seen of the oscillator's integrated circuit, plus YIG sphere 801 and its associated coupling loops (transistor collector excitation loop 808 and transistor base feedback loop 807). It can be seen that substrate 802 (which is the platform of the integrated circuit components) supports, and is electrically connected to transistor collector excitation loop 808 at one end at point 803, and at the other end at point 804. It can also be seen that substrate 802 supports, and is electrically connected to transistor base feedback loop 807 at one end at point 805, and at the other end at point 806. YIG sphere 801 is physically positioned between transistor collector excitation loop 808 and transistor base feedback loop 807.

The current flow through substrate 802 can also be seen as directional arrows found on the bottom drawing of substrate 802. Current flows from point 805 to point 806, and from point 803 to point 804.

Figure 9:
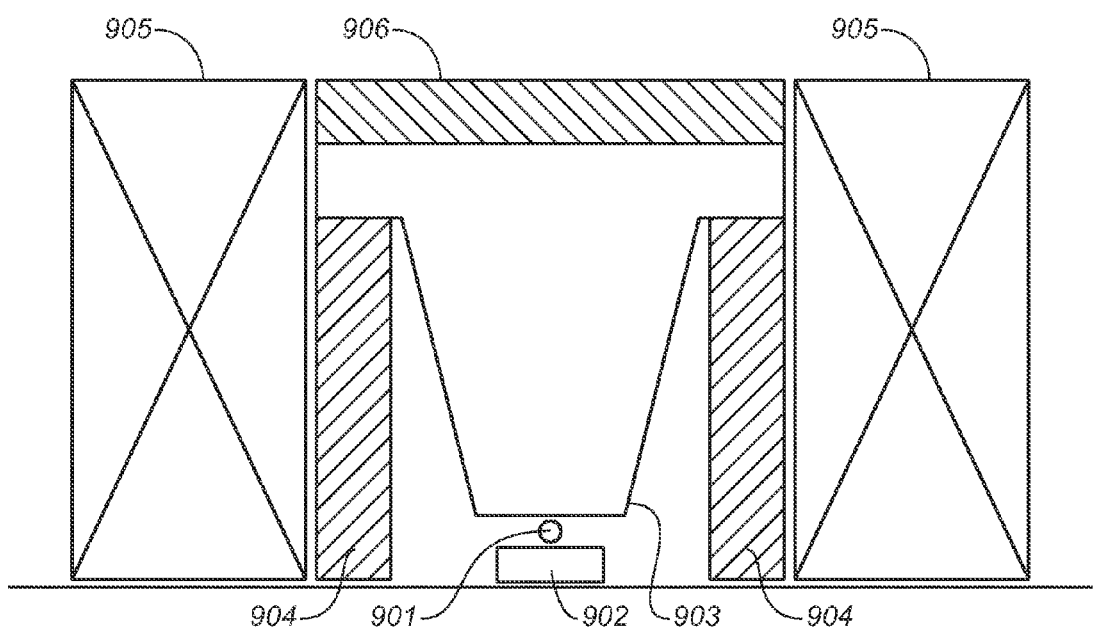
FIG. 9 is a schematic view showing a mechanical configuration of the differential ring oscillator's integrated circuit and its surrounding magnetic components.

Referring now to FIG. 9, what is shown is a mechanical configuration of the differential ring oscillator's integrated circuit and its surrounding magnetic components. It can be seen that YIG sphere 901 is positioned between field focuser 903 and integrated circuit board 902. Ring magnet 904 is positioned to encircle both field focuser 903 and YIG sphere 901. Electromagnet 905 is positioned to encircle field focuser 903 and ring magnet 904. Magnetic shield 906 is positioned above field focuser 903, and is attached to electromagnet 905 for support.

Figure 10:
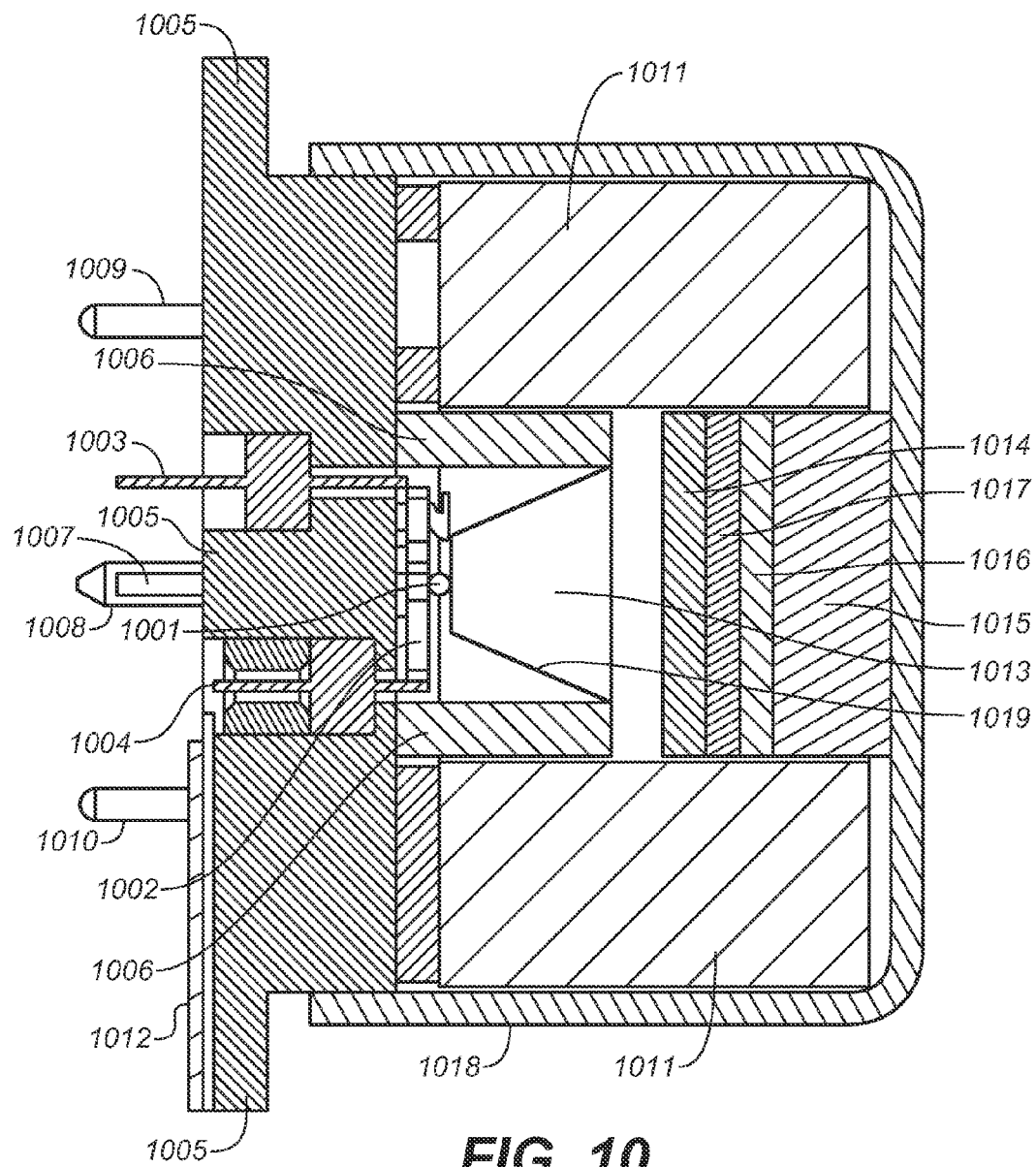
FIG. 10 is a cross-sectional side view in elevation showing an oscillator package incorporating a single ended oscillator with an oscillator truss support.

Next, referring to FIG. 10, a cross sectional drawing is seen of the total Vida oscillator package based on the prior art of the patented Vida single ended oscillator. This same general packaging technique may continue to be used with a differential oscillator.

It can be seen in FIG. 10 that a YIG sphere 1001 is positioned relative to circuit board 1002, and that circuit board 1002 is mounted on substrate 1005. Bias input terminal 1003, output terminal 1004 and Vcc input pin 1007 connect to circuit board 1002, through substrate 1005.

Substrate 1005 acts as circuit ground, and ground pin 1008 extends outward from substrate 1005, providing a convenient grounding point and mechanical mounting stability. Insulator 1012 covers a portion of the exterior of substrate 1005. Ring magnet 1006 surrounds YIG sphere 1001 and field focuser 1013. Ring magnet 1006 is surrounded by electromagnet 1011. Electromagnet 1011 has electrical connections that terminate at electromagnet connection pin 1009 at one end, and electromagnet connection pin 1010 at the other end.

Housing 1018 covers the magnetic components of the DRRO, making mechanical and electrical connection with substrate 1005 to provide a level of shielding. Shield magnet 1014 provides an additional level of shielding. Metallic shield 1017 is mounted against shield magnet 1014. Insulation 1016 is positioned between metallic shield 1017 and heat sink 1015.

It is also seen in FIG. 10 that truss support mechanism 1019 is used to support YIG sphere 1001 in the correct physical relationship with the other components of the oscillator.

Figure 11:
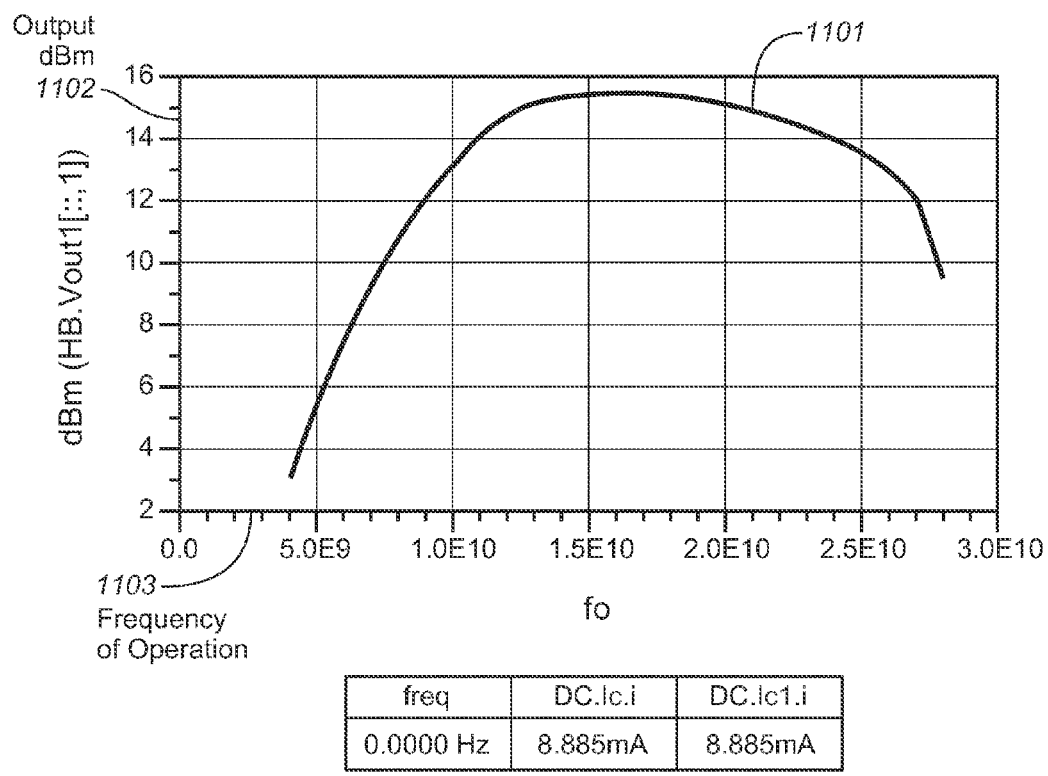
FIG. 11 is a graph showing the oscillator's simulated power output as a function of frequency.

Turning next to FIG. 11, what is shown is a graph of the oscillator's simulated power output as a function of frequency. This simulation is based on the electrical circuit model shown in FIG. 5, plus the electrical model for the NPN bipolar transistors. Simulated power output covers the frequency range of 4 GHz to 28 GHz, predicting a factor 7:1 electronic tuning range. Such tuning range is nearly impossible to achieve with other types of YIG oscillator circuits. A vertical dBm scale 1102 shows the level of output across a frequency range scale 1103 (extending horizontally across the bottom of the graph. Curve 1101 represents the simulated oscillator output across the represented frequency spectrum of frequency range scale 1103.

Figure 12:
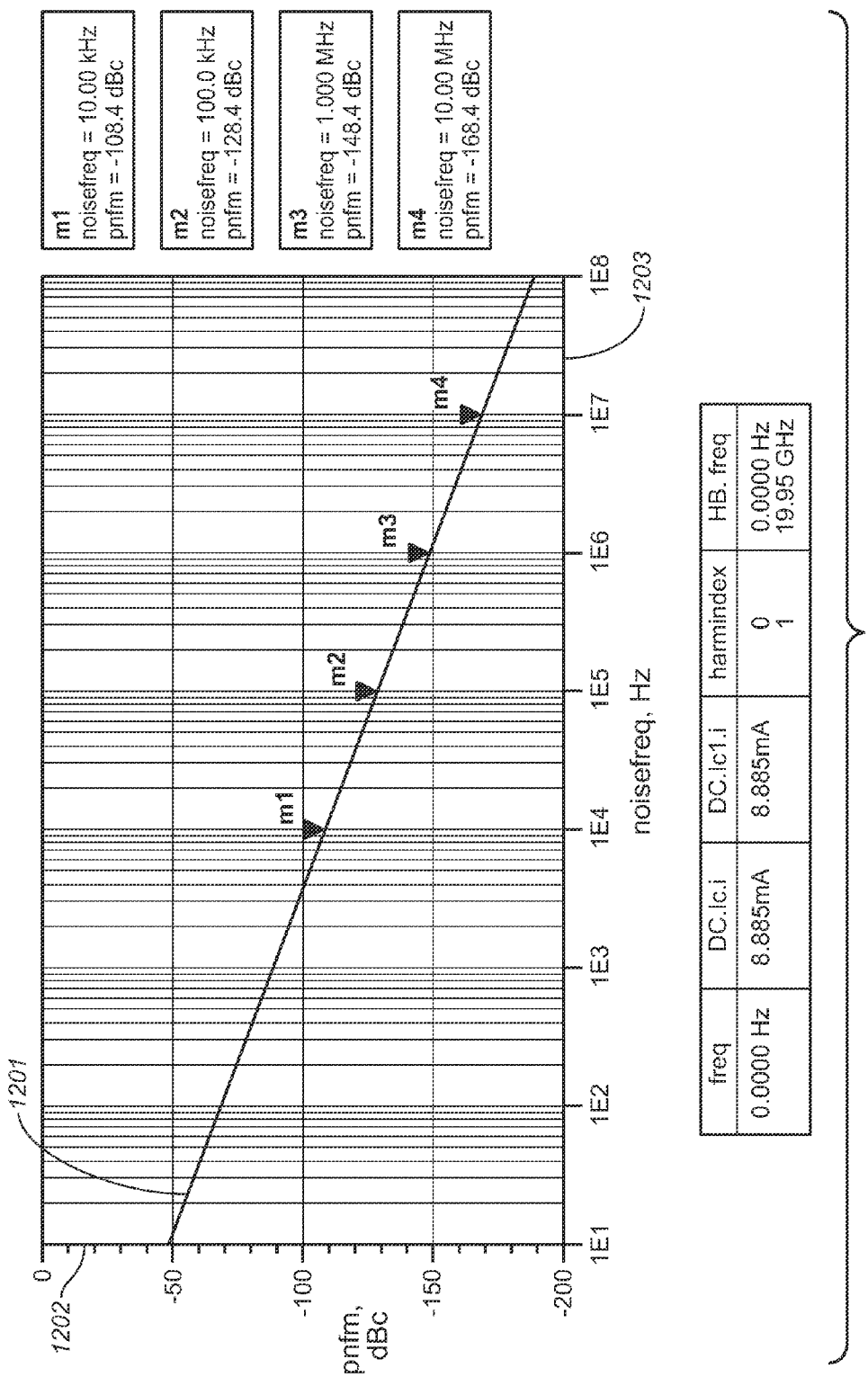
FIG. 12 is a graph showing the oscillator's simulated phase noise at 20 GHz.

Referring now to FIG. 12, what is seen is a graph of the oscillator's simulated phase noise at 20 GHz. A vertical dBc scale 1202 shows the level of phase noise across a frequency range scale 1203 (extending horizontally across the bottom of the graph. Curve 1203 represents the simulated phase noise across the represented frequency spectrum of frequency range scale 1203. Markers M1 through M4 mark specific points in the graph that are each detailed on the right hand side of the graph.

The same circuit model that was used for the power simulations shown in FIG. 10 is used to simulate phase noise in FIG. 12. At 20 GHz, the phase noise at a 10 kHz offset frequency is simulated as −108 dBc per Hz.

Figure 13:
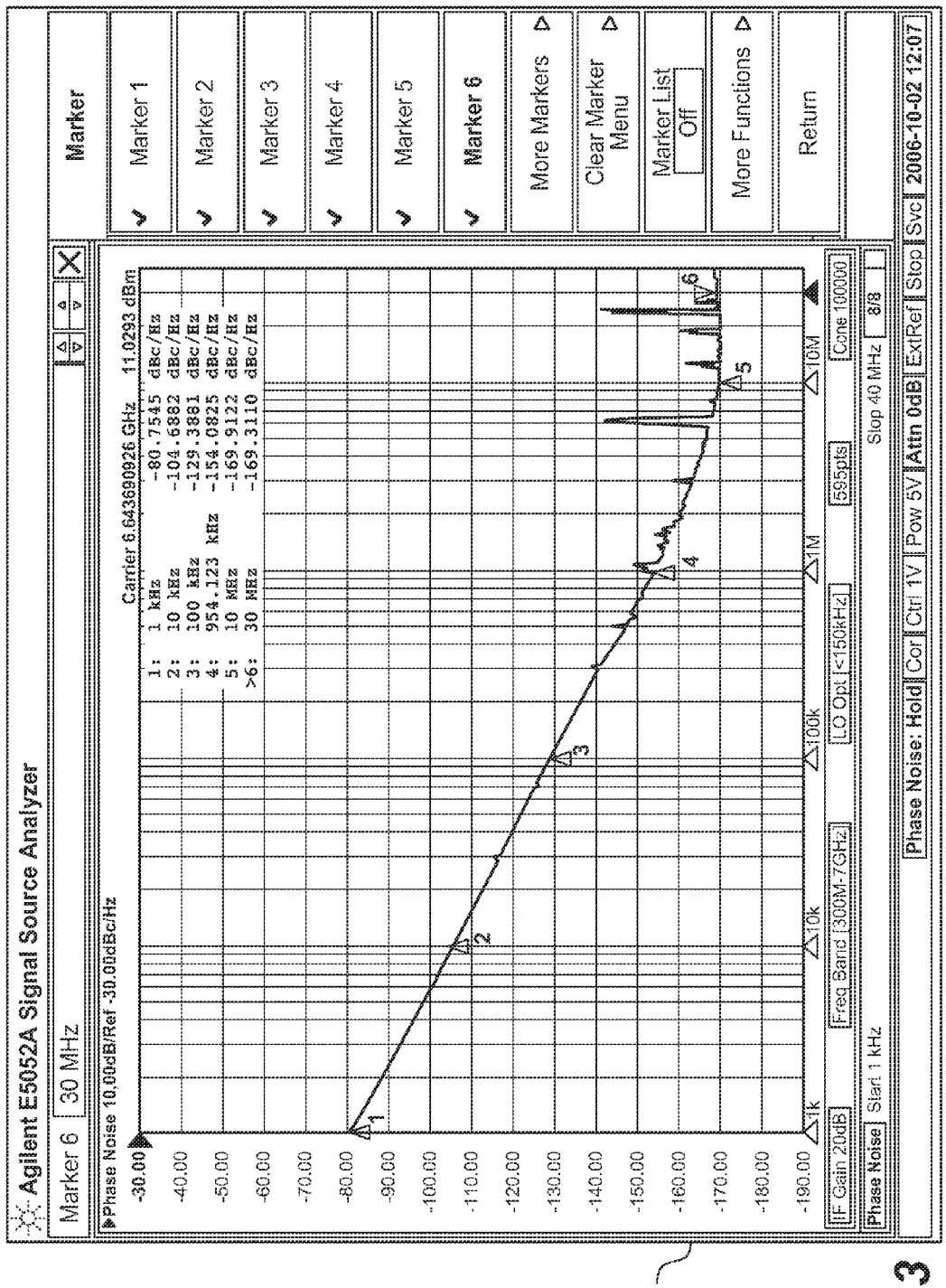
FIG. 13 is a screen shot of a spectrum analyzer screen showing a measured hybrid breadboard differential oscillator's phase noise at 6.6 GHz.

Referring now to FIG. 13, a picture of spectrum analyzer screen 1301 shows a measured hybrid breadboard differential oscillator's phase noise at 6.6 GHz. This measured phase noise is in excellent agreement with the simulated phase noise shown in FIG. 12.

Figure 14:
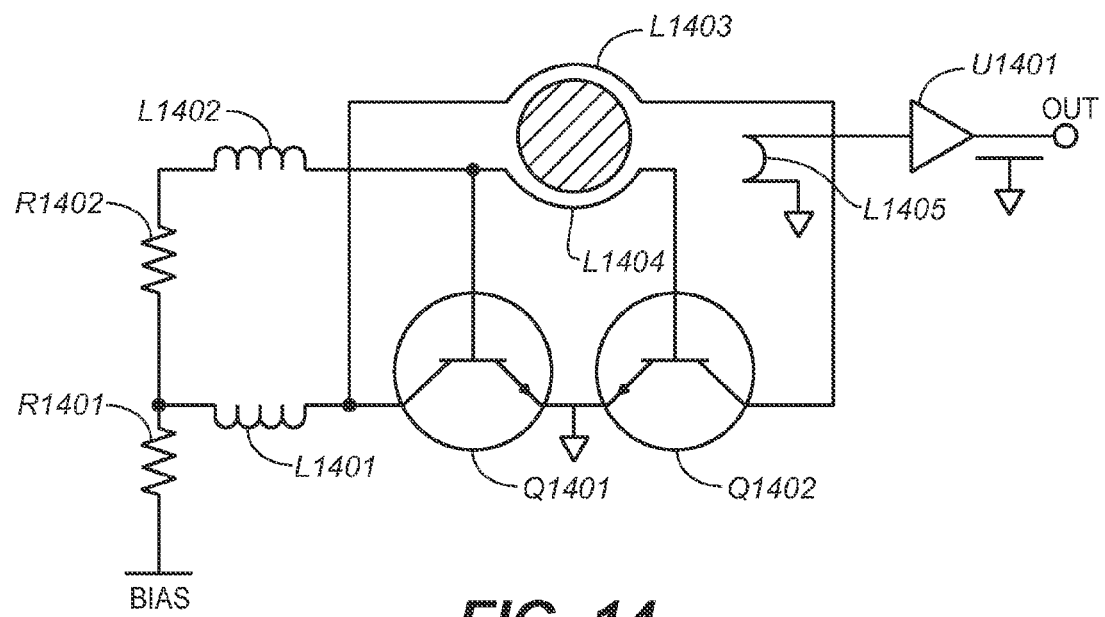
FIG. 14 is schematic diagram showing a hybrid test Differential Resonant Ring Oscillator (DRRO)

Referring now to FIG. 14, there is shown a circuit diagram for hybrid test differential resonant ring oscillator (DRRO), showing the loops, SiGe transistor, and YIG. It can be seen that the components of the DRRO circuit are arranged so that a bias current enters the circuit at the Bias terminal and is passed through resistances R1401 and R1402, which together act as a voltage divider. Resistance R1401 passes a bias voltage via inductor L1402 to the base of transistor Q1401, then through feedback loop L1404 and on to the base of transistor Q1402. The emitters of transistors Q1401 and Q1402 are connected directly to circuit ground. Inductor L1401 is connected to the junction of resistances R1401 and R1402, and provides a current source to the collector of transistor Q1401, and also, via excitation loop L1403, to the collector of transistor Q1402. Output loop 1405 transfers energy (coupled to the loop from YIG1401) into the input of amplifier U1401. The output of output amplifier U1401 is passed to output terminal OUT1401.

Figure 15:
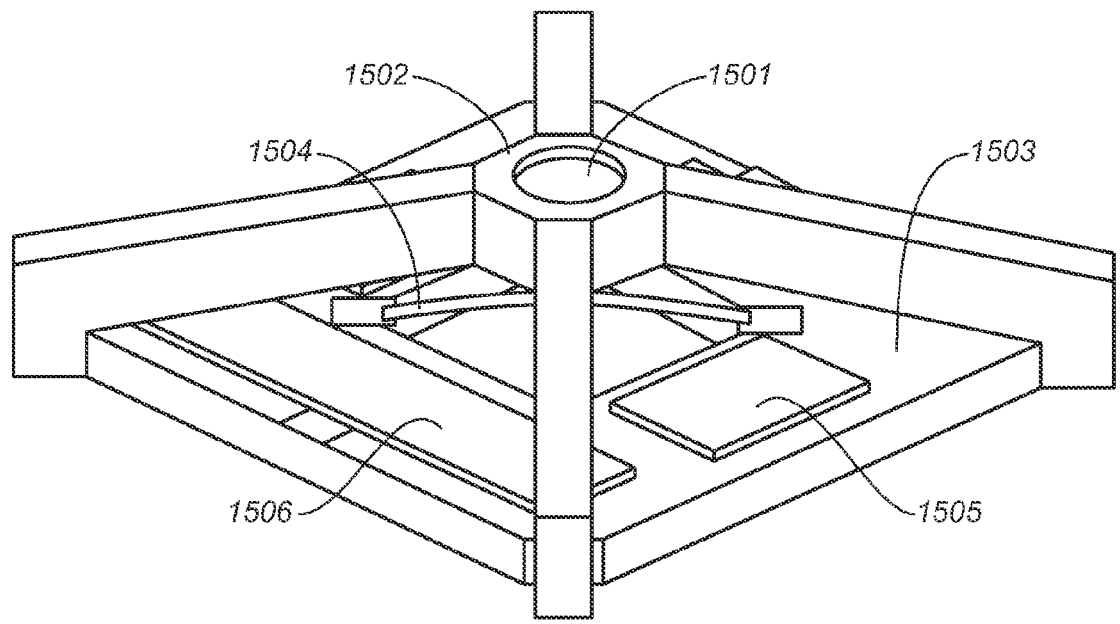
FIG. 15 is a drawing depicting the integrated circuit DRRO with support truss, coupling loops, MMIC, and YIG.

Referring now to FIG. 15, there is shown a drawing of a new hybrid structure used to implement the DRRO. It should be emphasized that this invention promotes a semiconductor foundry manufacture integrated circuit process that can greatly decrease manufacturing costs, thereby opening markets that cannot afford the superior phase noise performance of the current YIG technology. Using the low cost solution shown in FIG. 15 provides a method for installing a YIG Sphere that is both rugged and inexpensive. Truss support mechanism 1502 locks YIG sphere 1501 in place relative to the coupling structures (such as feedback loop 1504), and permits the insertion of an oriented YIG sphere 1501 in the proper height relative to the coupling structures.

Truss support mechanism 1502 is fastened to substrate 1503 at the corners. Substrate 1503 is the platform on which the other components of the circuit are mechanically attached (such as bias resistor 1506, amplifier 1505 and feedback loop 1504.

The advantageous manufacturing process is to pick up pre-oriented YIG sphere 1501 on a vacuum tool and precisely press the sphere into the hole in truss support mechanism 1502 to the correct height. Truss support mechanism 1502 is made out of injected molded structural plastic with a hole that is provide with tolerances to capture the sphere when it is released from the vacuum tool.

The foregoing disclosure is sufficient to enable those with skill in the relevant art to practice the invention without undue experimentation. The disclosure further provides the best mode of practicing the invention now contemplated by the inventors.

While the particular oscillator circuit topology herein shown and disclosed in detail is fully capable of attaining the objects and providing the advantages stated herein, it is to be understood that it is merely illustrative of the presently preferred embodiment of the invention and that no limitations are intended to the detail of construction or design herein shown other than as defined in the appended claims. Accordingly, the proper scope of the present invention should be determined only by the broadest interpretation of the appended claims so as to encompass all such modifications as well as all relationships equivalent to those illustrated in the drawings and described in the specification.

What is claimed as invention is:

1. A tunable yttrium iron garnet (YIG) resonant oscillator circuit with a closed-loop ring oscillator topology, said circuit comprising:

a magnet field tuned YIG sphere positioned in the near field of a ring magnet and magnetic field focuser and magnetically coupled to at least two conductive loops, including a first and a second conductive loop, each of said conductive loops proximate said YIG sphere;

first and second amplifiers operating together as a differential pair, each configured for a gain greater than one, arranged in a feedback loop configuration, wherein the direct current ground terminal of each of said amplifiers is connected directly to circuit ground, and further wherein the output terminal of said first amplifier is coupled to the output terminal of said second amplifier through said first conductive loop, and the input terminal of said first amplifier is coupled to the input terminal of a said second amplifier through said second conductive loop;

a direct current source for providing operating and bias voltages to both of said first and second amplifiers; and wherein said resonant oscillator circuit oscillates at a frequency that is dependent on the resonant frequency of said YIG sphere, and said resonant frequency can be adjusted by varying said magnetic field.

2. The tunable YIG resonant oscillator circuit of claim 1, further including:

an output conductive loop positioned proximate to said YIG sphere and reacting to the magnetic field fluctuations present in the proximity of said YIG sphere; and a buffering amplifier having an input electrically connected to said output conductive loop for amplifying the oscillation signal generated by said tunable YIG resonant oscillator circuit.

3. The tunable YIG resonant oscillator circuit of claim 1, further including:

a YIG sphere support structure for insertion of said YIG sphere in said YIG sphere support structure, said YIG sphere support structure being mounted on the substrate of said resonant oscillator and positioned such that said YIG sphere properly oriented in relation to said first and second conductive loops.

4. The tunable YIG resonant oscillator circuit of claim 3, wherein said YIG sphere support structure includes mounting legs for mounting onto said substrate of said resonant oscillator, and also having a cavity receptacle for receiving said YIG sphere, said receptacle being shaped to capture and hold said YIG sphere after said YIG sphere has been placed into said YIG sphere support structure.

5. The tunable YIG resonant oscillator circuit of claim 1, wherein said YIG sphere has a resonant frequency equal to a fundamental constant multiplied by the strength of the magnetic field in which said YIG sphere is encompassed.

6. The tunable YIG resonant oscillator circuit of claim 1, wherein each of said first and second amplifiers has an input-to-output phase shift that is substantially 270 degrees at the operating frequency of said oscillator circuit, and the phase shift around the entire oscillator circuit loop is substantially a multiple of 360 degrees.

* * * * *